United States Patent
Sakamoto et al.

(10) Patent No.: US 7,964,867 B2
(45) Date of Patent: Jun. 21, 2011

(54) SWITCHING ELEMENT, SWITCHING ELEMENT FABRICTION METHOD, RECONFIGURABLE LOGIC INTEGRATED CIRCUIT, AND MEMORY ELEMENT

(75) Inventors: Toshitsugu Sakamoto, Tokyo (JP); Hisao Kawaura, Tokyo (JP)

(73) Assignee: NEC Corporation, Tokyo (JP)

( * ) Notice: Subject to any disclaimer, the term of this patent is extended or adjusted under 35 U.S.C. 154(b) by 707 days.

(21) Appl. No.: 11/813,075

(22) PCT Filed: Dec. 22, 2005

(86) PCT No.: PCT/JP2005/023579
§ 371 (c)(1),
(2), (4) Date: Jun. 28, 2007

(87) PCT Pub. No.: WO2006/070683
PCT Pub. Date: Jul. 6, 2006

(65) Prior Publication Data
US 2008/0212259 A1    Sep. 4, 2008

(30) Foreign Application Priority Data
Dec. 28, 2004  (JP) ................................ 2004-378700

(51) Int. Cl.
*H01L 29/10*    (2006.01)

(52) U.S. Cl. .......................................... 257/43; 257/44
(58) Field of Classification Search ............... 257/43, 257/44
See application file for complete search history.

(56) References Cited

U.S. PATENT DOCUMENTS

| 6,418,049 B1 * | 7/2002 | Kozicki et al. ............. 365/174 |
| 2002/0168820 A1 * | 11/2002 | Kozicki et al. ............. 438/259 |

FOREIGN PATENT DOCUMENTS

| JP | 2001-525606 A | 12/2001 |
| JP | 2002-536840 A | 10/2002 |
| JP | 2003-92387 A | 3/2003 |

* cited by examiner

*Primary Examiner* — Thinh T Nguyen
(74) *Attorney, Agent, or Firm* — Sughrue Mion, PLLC

(57) ABSTRACT

The switching element of the present invention includes an ion conduction layer (40) capable of conducting metal ions, a first electrode (21) and a second electrode (31) provided in contact with the ion conduction layer (40), and a third electrode (35) provided in contact with the ion conduction layer (40) and capable of supplying metal ions, and is of a configuration in which the area over which the first electrode (21) contacts the ion conduction layer (40) is smaller than the area over which the second electrode (31) contacts the ion conduction layer (40). The use of this configuration decreases the leak current in the OFF state.

14 Claims, 6 Drawing Sheets

SWITCHING ELEMENT, SWITCHING ELEMENT FABRICTION METHOD, RECONFIGURABLE LOGIC INTEGRATED CIRCUIT, AND MEMORY ELEMENT

TECHNICAL FIELD

The present invention relates to a switching element that employs an electrochemical reaction, a fabrication method of the switching element, a reconfigurable logic integrated circuit, and a memory element.

BACKGROUND ART

Application Specific Integrated Circuit (ASIC) are provided with a plurality of logic cells that serve as the basic logic circuits, the logic cells that are caused to operate being selected to match the user's specifications. ASIC include conventional ASIC in which the logic cells are determined in an interconnect patterning step in the fabrication process and programmable logic (reconfigurable logic integrated circuits) in which the logic cells are determined by the user after shipment of the product. Although conventional ASIC has the merit of cheap product unit cost realized by mass production, it suffers from the demerits of high development cost and lengthy development time. On the other hand, although programmable logic has higher product unit price and slower operating speed than conventional ASIC, it enjoys the advantages of low development cost and short development time. Development is currently underway to both improve the operational performance and reduce the size of switching elements for selecting logic cells for programming for the purpose of achieving lower product unit costs, faster operating speed, and lower power consumption of programmable logic.

In programmable logic, a plurality of logic cells is provided, switching elements as described above being connected between each logic cell and signal line. The application of the programmable device disclosed in JP-A-2002-536840 (hereinbelow referred to as Patent Document 1) for these switching elements can be considered.

DISCLOSURE OF THE INVENTION

Power consumption is one factor that indicates the performance of a programmable logic device. A key point for reducing the power consumption of a device is reducing the current when the plurality of switches provided in the device are OFF.

When an ion conduction layer having a comparatively high electrical conductivity such as copper sulfide is used in the two-terminal switching element disclosed in Patent Document 1, the application of a logic signal of the operating voltage as input to one electrode causes a minute current to flow between that electrode and the other electrode by way of the ion conduction layer even when the switch is in the OFF state. This current is the leak current of the switching element. Sufficient reduction of leak currents has not been achieved in conventional switching elements, and switching elements having a lower leak current are being sought. The leak current of one switching element is preferably suppressed to 10 nA or less when a logic signal of the operating voltage is applied as input.

The present invention was realized for solving the above-described problem of the related art and has as its object the provision of a switching element in which the leak current in the OFF state is reduced, a method of fabricating the switching element, and a reconfigurable logic integrated circuit and memory element that use this switching element.

The switching element of the present invention for achieving the above-described object is a switching element provided with an ion conduction layer that can conduct metal ions; the switching element including a first and a second electrode provided in contact with the ion conduction layer and a third electrode provided in contact with the ion conduction layer and that can supply metal ions; and the switching element being of a configuration in which the area over which the first electrode contacts the ion conduction layer is smaller than the area over which the second electrode contacts the ion conduction layer.

In the present invention, the area over which the first electrode contacts the ion conduction layer is less than the area over which the second electrode contacts the ion conduction layer, whereby a reduction is achieved in the leak current that flows between the first electrode and the second electrode when the switching element is in the OFF state. As a result, compared to the related art, the switching element of the present invention enables a reduction of the leak current that flows between the electrodes during the OFF state despite the use of an ion conduction layer having high electrical conductivity.

EXPLANATION OF REFERENCE NUMBERS 11, 12, 21, 26 first electrode
13, 14, 31, 32 second electrode
34, 35 third electrode
40, 42 ion conduction layer

BEST MODE FOR CARRYING OUT THE INVENTION

The switching element of the present invention is a device provided with an insulating layer for both drastically reducing the size of the path of current between electrodes in the ON state and decreasing the leak current of the OFF state.

First Embodiment

Explanation next regards the configuration of the two-terminal switch of the present embodiment.

Figure 1:
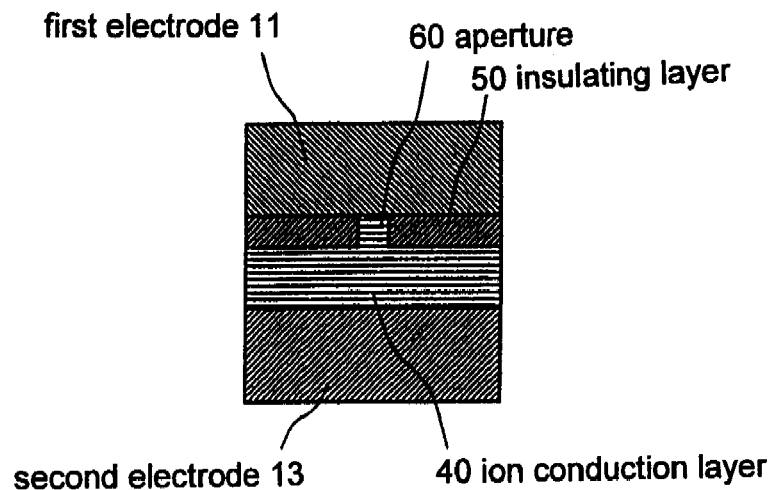
FIG. 1 is a schematic sectional view showing an example of the configuration of a two-terminal switch of the first embodiment.

FIG. 1 is a schematic sectional view showing an example of the configuration of the two-terminal switch of the present embodiment.

As shown in FIG. 1, the two-terminal switch includes first electrode 11, ion conduction layer 40 provided in contact with first electrode 11, and second electrode 13 provided in contact with ion conduction layer 40. Ion conduction layer 40 is a medium for conducting metal ions. First electrode 11 and ion conduction layer 40 are connected by aperture 60 that is a current path provided in insulating layer 50. Aperture 60 is a current path formed by dielectric breakdown at points of low dielectric strength in insulating layer 50. This aperture 60 should allow necessary current to flow at least during the ON state, and should be as small as possible. First electrode 11 contacts ion conduction layer 40 by way of aperture 60, and the surface area over which first electrode 11 contacts ion conduction layer 40 is therefore smaller than the area over which second electrode 13 contacts ion conduction layer 40. If aperture 60 is assumed to be a circle, making the diameter of aperture 60 0.1 µm or less enables a reduction of the leak current during OFF state to 10 nA or less, 10 nA being the permissible leak current of programmable logic during the OFF state. The shape of aperture 60 is not limited to a circle and may also be an oval or a polygon. When an oval, the length of the major axis is 0.1 µm or less; and when a polygon, the maximum value of a diagonal is 0.1 µm or less.

Explanation next regards details of the operation and fabrication method of a working example of this two-terminal switch.

First Working Example

Explanation next regards the configuration of the two-terminal switch of the present working example.

Figure 2:
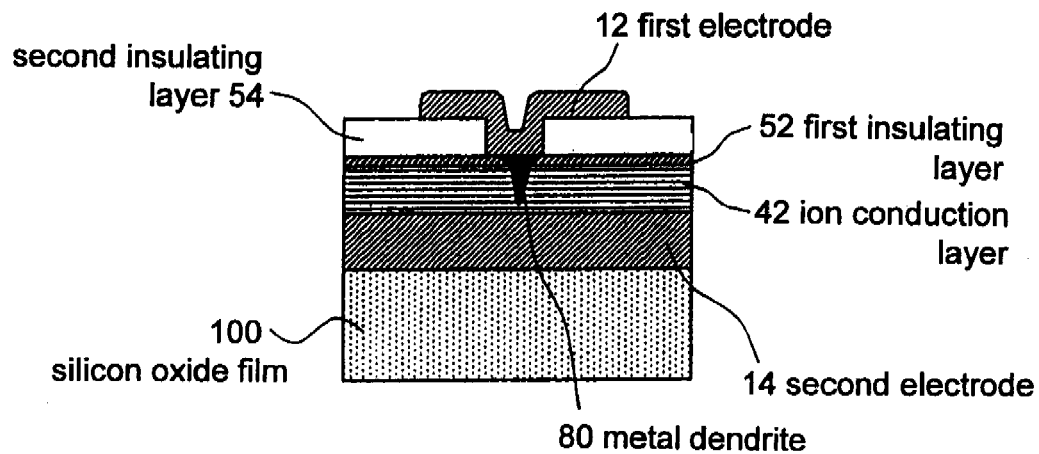
FIG. 2 is a schematic sectional view showing an example of the configuration of a two-terminal switch of the present working example.

FIG. 2 is a schematic sectional view showing an example of the configuration of the two-terminal switch of the present working example.

As shown in FIG. 2, in the two-terminal switch, each of second electrode 14 composed of copper, ion conduction layer 42 composed of copper sulfide, and first insulating layer 52 composed of copper oxide are provided on silicon oxide film 100 composed of an insulating material formed on the surface of a silicon substrate. Second insulating layer 54 having an aperture with a diameter of 0.2 µm is formed on this first insulating layer 52, and first electrode 12 composed of platinum is formed on this second insulating layer 54. First electrode 12 contacts first insulating layer 52 by way of the aperture of second insulating layer 54. Further, as shown in FIG. 2, in the present working example, an aperture is formed in first insulating layer 52, and metal dendrite 80 is formed that passes from first electrode 12, through the aperture, and into ion conduction layer 42. The metal dendrite electrically connects first electrode 12 and second electrode 14.

Explanation next regards the operation of the two-terminal switch shown in FIG. 2.

In the state that precedes the application of voltage, first electrode 12 and second electrode 14 are electrically connected by way of a metal dendrite of copper that passes through the aperture. The initial state of the two-terminal switch is the ON state. To turn the two-terminal switch OFF, a positive voltage is applied to first electrode 12 relative to second electrode 14. The positive voltage applied to first electrode 12 causes metal dendrite 80 to become copper ions and dissolve into ion conduction layer 42, following which the dissolved copper ions become copper and precipitate on the surface of the second electrode, whereby a portion of metal dendrite 80 is electrically cut and the two-terminal switch transitions to the OFF state. From a stage preceding the complete severance of the electrical connection, the electrical properties undergo changes such as increases in the resistance between first electrode 12 and second electrode 14 and changes in the capacitance across the electrodes, following which the electrical connection is finally cut.

On the other hand, when the two-terminal switch is in the OFF state and a negative voltage is applied to first electrode 12, second electrode 14 supplies copper ions to ion conduction layer 42. In addition, copper ions from ion conduction layer 42 become copper and precipitate on the portion of metal dendrite 80 that was electrically cut. Metal dendrite 80 then connects first electrode 12 and second electrode 14, and the two-terminal switch transitions to the ON state.

In the following explanation, the voltage for causing the switch to transition from the ON state to the OFF state or from the OFF state to the ON state is referred to as the "switching voltage."

Explanation next regards the results of comparing the operation characteristics of the two-terminal switch of the present working example with a case of the related art.

Figure 3:
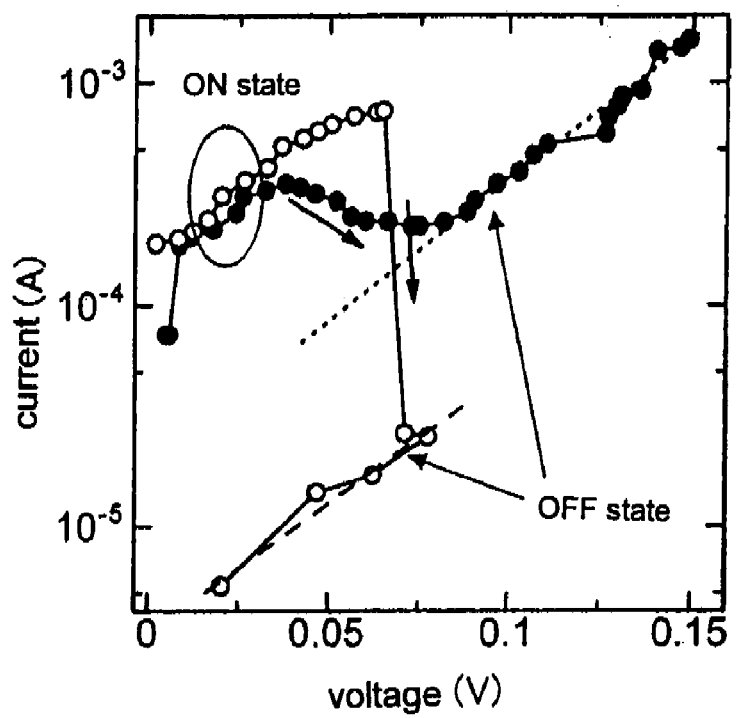
FIG. 3 is a graph showing the relation between voltage and current in the two-terminal switch of the present working example.

FIG. 3 is a graph showing the relation between current and the voltage that is applied to the first electrode, the horizontal axis showing the voltage that is applied to the first electrode, and the vertical axis showing the current that flows between the electrodes. The operation characteristics of a two-terminal switch of the related art are indicated by black dots, and the operation characteristics of a two-terminal switch of the present working example are indicated by white dots.

As shown in FIG. 3, the application of a positive voltage to the first electrode causes the two-terminal switch to transition from the ON state to the OFF state. In the two-terminal switch of the present working example, the ON/OFF ratio of at least one decimal place is obtained. Comparing the OFF state current in a two-terminal switch of the related art and a two-terminal switch of the present working example, the two-terminal switch of the present working example is smaller by one decimal place than the related art.

Based on the results of FIG. 3, it can be seen that a case provided with a first insulating layer of copper oxide achieves OFF current that is smaller by one decimal place than the related art and thus achieves a reduction of the leak current.

Explanation next regards the fabrication method of the two-terminal switch shown in FIG. 2.

Figure 4A:
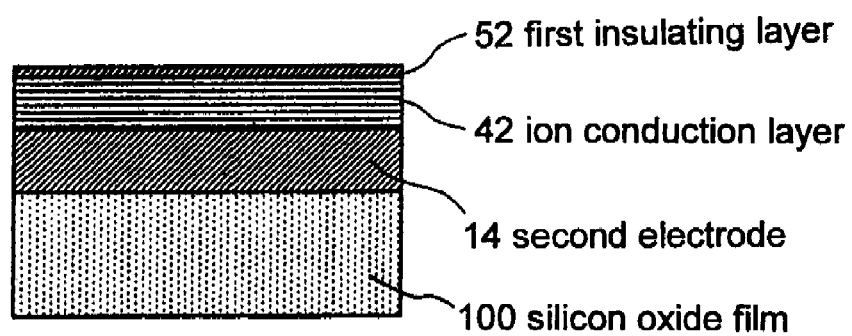
FIG. 4A is a schematic sectional view showing the method of fabricating the two-terminal switch of the present working example.
Figure 4B:
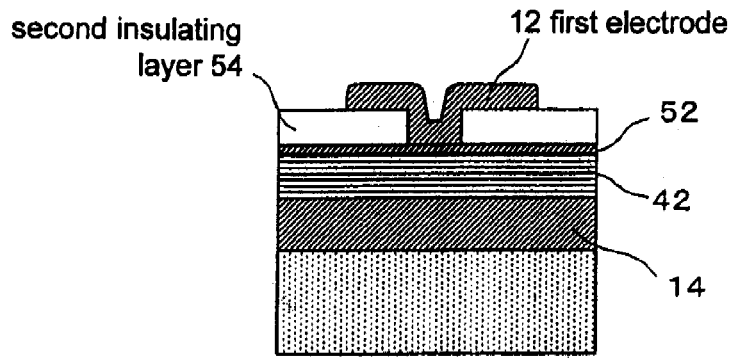
FIG. 4B is a schematic sectional view showing the method of fabricating the two-terminal switch of the present working example.
Figure 4C:
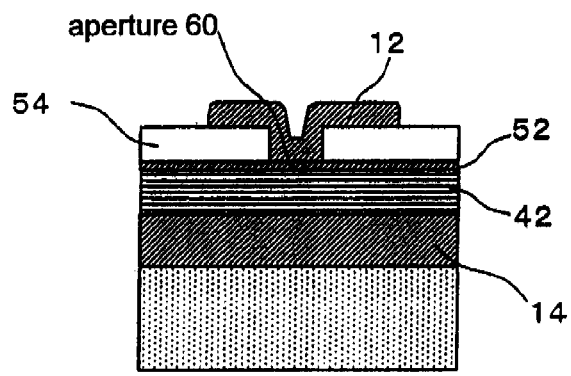
FIG. 4C is a schematic sectional view showing the method of fabricating the two-terminal switch of the present working example.

FIGS. 4A to 4C are schematic sectional views showing the fabrication method of the two-terminal switch.

As shown in FIG. 4A, silicon oxide film 100 with a film thickness of 300 nm is formed on the surface of a silicon substrate. A resist pattern is formed by conventional lithographic techniques on silicon oxide film 100 at points in which second electrode 14 is not to be formed. Copper is next formed over this resist pattern to a film thickness of 100 nm by a vacuum evaporation method, following which the resist pattern is lifted off by a lift-off technique, thereby forming second electrode 14 as the remaining copper portions.

Copper sulfide that is to serve as ion conduction layer 42 is next formed to a thickness of 40 nm by a laser ablation method to cover the upper surface and side surfaces of second electrode 14. The copper sulfide surface is next oxidized by an oxygen plasma ashing method to form copper oxide that is to serve as first insulating layer 52. The ashing time was one minute. It is estimated that the film thickness of the copper oxide that is formed by this ashing is on the order of several nanometers.

As shown in FIG. 4B, a calixarene that is to serve as second insulating layer 54 is further applied to a film thickness of 120 nm by a spin coat on first insulating layer 52, and a pattern having an aperture with a diameter of 0.2 µm is formed on second insulating layer 54 by a lithographic technique. The aperture is here formed in the pattern that is positioned over second electrode 14. Platinum that is to serve as first electrode 12 is then formed to a film thickness of 40 nm by successively carrying out formation of a resist pattern, vacuum evaporation, and lift-off.

Explanation next regards the method of forming the metal dendrite.

After forming first electrode 12, second electrode 14 is grounded and a voltage of −1 V is applied to first electrode 12. The application of voltage to first electrode 12 causes a portion of first insulating layer 52 that contacts first electrode 12 to break down, whereby aperture 60 that links first electrode 12 and ion conduction layer 42 is formed (FIG. 4C). Metal dendrite 80 of copper then grows from first electrode 12 to second electrode 14 to electrically connect the two electrodes as shown in FIG. 2.

The aperture of second insulating layer 52 may also be formed by lithographic and dry-etching techniques.

As described in the foregoing explanation, the two-terminal switch of the present embodiment can both ensure adequate current that flows between the two electrodes by way of the aperture and the metal dendrite when in the ON state and, by providing a second insulating layer between the first electrode and the ion conduction layer, can make the area over which the first electrode contacts the ion conduction layer as small as possible and thus reduce the leak current that flows between the two electrodes when in the OFF state.

Second Embodiment

Explanation next regards the configuration of the three-terminal switch of the present embodiment.

Figure 5:
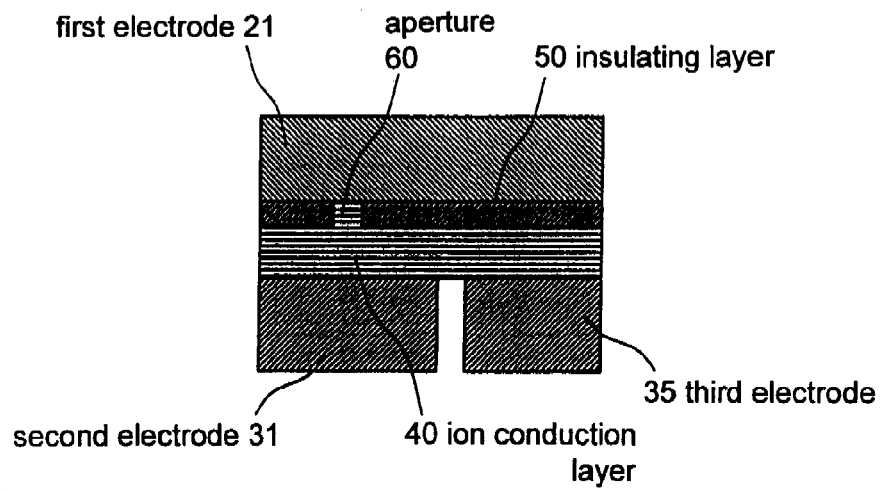
FIG. 5 is a schematic sectional view showing an example of the configuration of a three-terminal switch of the second embodiment.

FIG. 5 is a schematic sectional view showing an example of the configuration of the three-terminal switch of the present embodiment.

As shown in FIG. 5, the three-terminal switch includes first electrode 21, ion conduction layer 40 provided in contact with first electrode 21, and second electrode 31 and third electrode 35 provided in contact with ion conduction layer 40. The distance between second electrode 31 and third electrode 35 is 0.2 µm, and second electrode 31 and third electrode 35 are thus arranged separated by this distance. First electrode 21 and ion conduction layer 40 are in contact by aperture 60 that is provided in insulating layer 50 and that serves as the path of current. Aperture 60 is provided at a position that confronts the second electrode with ion conduction layer 40 interposed.

As in the first embodiment, this aperture 60 should allow necessary current to flow at least during the ON state and should be as small as possible. If aperture 60 is assumed to be a circle, making the diameter of aperture 60 no greater than 0.2 µm enables a reduction of the leak current during the OFF state to 10 nA or less, 10 nA being the permissible leak current in programmable logic. As in the first embodiment, the shape of aperture 60 is not limited to a circle, and may be an oval or polygon. First electrode 21 contacts ion conduction layer 40 by way of this aperture 60, and the surface over which first electrode 21 contacts ion conduction layer 40 is therefore smaller than the area over which second electrode 31 contacts ion conduction layer 40.

Explanation next regards details of the operation and fabrication method of a working example of this three-terminal switch.

Second Working Example

Explanation next regards the configuration of the three-terminal switch of the present working example.

Figure 6:
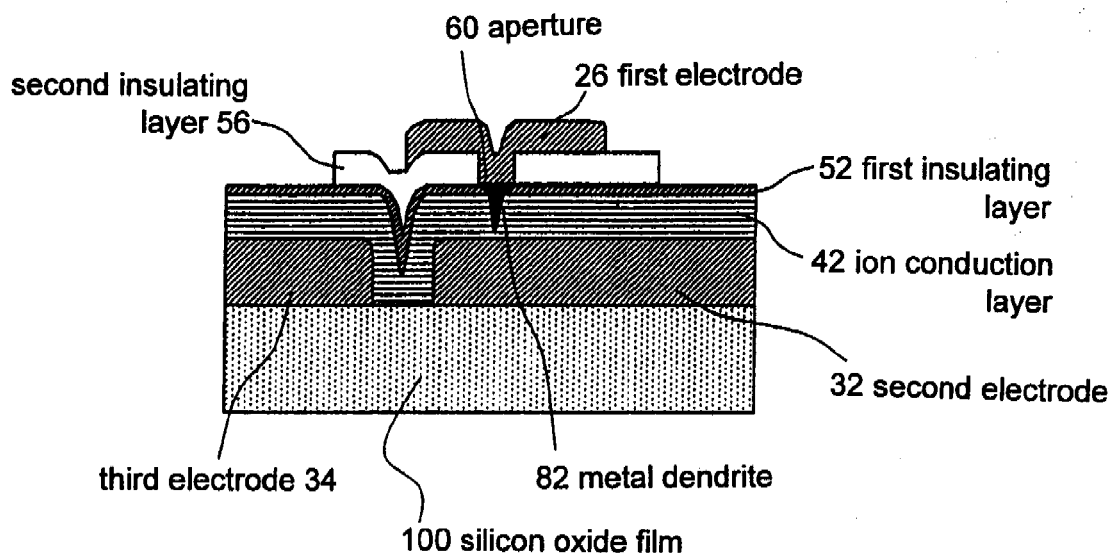
FIG. 6 is a schematic sectional view showing an example of the configuration of the three-terminal switch of the present working example.

FIG. 6 is a schematic sectional view showing an example of the configuration of the three-terminal switch of the present working example.

As shown in FIG. 6, the three-terminal switch is provided with second electrode 32 and third electrode 34 composed of copper on silicon oxide film 100 formed on the surface of a silicon substrate. The distance between second electrode 32 and third electrode 34 is 0.2 µm, and second electrode 32 and third electrode 34 are thus arranged separated by this distance. Ion conduction layer 42 composed of copper sulfide is provided to cover the upper surfaces and side surfaces of second electrode 32 and third electrode 34. First insulating layer 52 composed of copper oxide is provided on ion conduction layer 42, and second insulating layer 56 having an aperture with a diameter of 0.2 µm is formed on first insulating layer 52. This aperture is provided at a position that confronts second electrode 32 with first insulating layer 52 and ion conduction layer 42 interposed. First electrode 26 composed of platinum is formed on second insulating layer 56. First electrode 26 contacts first insulating layer 52 by way of the aperture of second insulating layer 56.

In addition, as shown in FIG. 6, in the present working example, aperture 60 is formed in first insulating layer 52, and metal dendrite 82 is formed that reaches from first electrode 26, through aperture 60, and into ion conduction layer 42.

Explanation next regards the operation of the three-terminal switch shown in FIG. 6.

In the state that precedes the application of voltage, first electrode 26 and second electrode 32 are electrically connected by way of metal dendrite 82 of copper that passes through aperture 60. The initial state of the three-terminal switch is the ON state. To turn OFF the three-terminal switch, a negative voltage is applied to third electrode 34 relative to first electrode 26 and second electrode 32 in which the potential is equalized. The negative voltage of third electrode 34 causes the copper of metal dendrite 82 to become copper ions and dissolve in ion conduction layer 42, and the dissolved copper ions then become copper and precipitate on the surface of the third electrode. As a result, a portion of metal dendrite 82 is electrically cut and the three-terminal switch transitions to the OFF state.

On the other hand, when the three-terminal switch is in an OFF state and a positive voltage is applied to third electrode 34, third electrode 34 supplies copper ions to ion conduction layer 42. Copper ions from ion conduction layer 42 become copper and precipitate on the portion of metal dendrite 82 that was electrically cut. Metal dendrite 82 then connects first electrode 26 and second electrode 32 and the three-terminal switch transitions to the ON state.

Explanation next regards the method of fabricating the three-terminal switch shown in FIG. 6. The fabrication process in the configuration from the points at which second electrode 32 is formed up to first electrode 26 are the same as shown in FIGS. 4A to 4B.

Silicon oxide film 100 is formed to a film thickness of 300 nm on the surface of a silicon substrate. Using conventional lithographic techniques, a resist pattern is formed on silicon oxide film 100 at points at which second electrode 32 and third electrode 34 are not to be formed. Copper is then formed by plating over this resist pattern to a film thickness of 100 nm, following which the resist pattern is lifted off by a lift-off technique to form the remaining copper portions as second electrode 32 and third electrode 34. At this time, the distance of 0.2 µm between second electrode 32 and third electrode 34 is set by the dimensions of the resist pattern of the lithographic technique.

Copper sulfide is next formed to a film thickness of 40 nm by a laser ablation method to serve as ion conduction layer 42 that covers the upper surfaces and side surfaces of second electrode 32 and third electrode 34. The surface of the copper sulfide is then oxidized by an oxygen plasma ashing method to form copper oxide that will serve as first insulating layer 52. The ashing time is one minute, and the film thickness of the copper oxide is estimated to be on the order of several nanometers.

Calixarene that is to serve as second insulating layer 56 is next applied by a spin coat to a film thickness of 120 nm on first insulating layer 52, and a pattern having aperture 60 with a diameter of 0.2 µm is formed by a lithographic technique on second insulating layer 56. At this time, aperture 60 is formed at a point of second insulating layer 56 located over second electrode 32. Platinum that serves as first electrode 26 is then formed to a film thickness of 40 nm by successively carrying out the processes of resist pattern formation, vacuum evaporation, and lift-off.

Explanation next regards the method of fabricating the metal dendrite.

Second electrode 32 and third electrode 34 are grounded and a voltage on the order of −1 V is applied to first electrode 26. The application of voltage to first electrode 26 causes a portion of first insulating layer 52 that contacts first electrode 26 to break down, whereby aperture 60 is formed that links first electrode 26 and ion conduction layer 42. Metal dendrite 82 of copper grows from first electrode 26 to second electrode 32 to electrically connect the two electrodes.

As described in the foregoing explanation, the three-terminal switch of the present working example can ensure the adequate flow of current between the first electrode and second electrode by way of an aperture and metal dendrite when in the ON state, and further, by providing a second insulating layer between the first electrode and the ion conduction layer, can drastically reduce the area over which the first electrode contacts the ion conduction layer and thus reduce the leak current that flows between the first electrode and the second electrode when in the OFF state.

Third Working Example

The present working example is a configuration in which an aperture is not formed in the first insulating layer.

Figure 7:
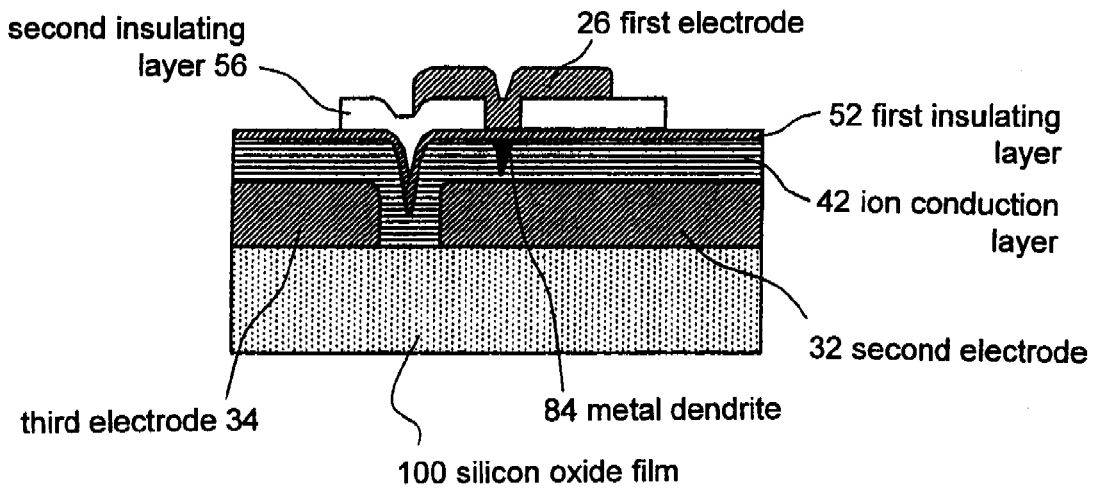
FIG. 7 is a schematic sectional view showing an example of the configuration of the three-terminal switch in another working example.

FIG. 7 is a schematic sectional view showing an example of the configuration of the three-terminal switch of the present working example. Components that are equivalent to the second working example are given the same reference numbers, and redundant detailed explanation of these components is omitted.

As shown in FIG. 7, in the present working example, metal dendrite 84 is formed in ion conduction layer 42 below first insulating layer 52 at the point at which first electrode 26 contacts first insulating layer 52. The distance between second electrode 32 and third electrode 34 is 0.2 µm, and second electrode 32 and third electrode 34 are therefore arranged separated by this distance. The diameter of the aperture provided in second insulating layer 56 is 0.2 µm.

Explanation next regards the operation of the three-terminal switch shown in FIG. 7.

In the state preceding application of voltage, metal dendrite 84 below first insulating layer 52 is connected to second electrode 32, this state being the ON state of the three-terminal switch. The resistance between first electrode 26 and second electrode 32 in the ON state is the sum of the resistance of metal dendrite 84 and first insulating layer 52. First insulating layer 52 must be thin enough to obtain the tunnel current of holes or electrons and therefore preferably has a thickness of from 1 nm to 100 nm.

In order to turn OFF the three-terminal switch, a negative voltage is applied to third electrode 34 relative to first electrode 26 and second electrode 32 in which the potential has been equalized. The negative voltage of third electrode 34 causes the copper of metal dendrite 84 to become copper ions and dissolve in ion conduction layer 42, and the dissolved copper ions then become copper and precipitate on the surface of the third electrode, whereby a portion of metal dendrite 84 is cut and the three-terminal switch transitions to the OFF state.

On the other hand, when the three-terminal switch is in the OFF state and a positive voltage is applied to third electrode 34, third electrode 34 supplies copper ions to ion conduction layer 42. The copper ions from ion conduction layer 42 become copper and precipitate on the portion of metal dendrite 84 that was cut, whereby the three-terminal switch then transitions to the above-described ON state.

Explanation next regards the method of fabricating the three-terminal switch shown in FIG. 7. Detailed explanation regarding steps that are equivalent to the second working example is omitted.

As in the second working example, second electrode 32, third electrode 34, first insulating layer 52, second insulating layer 56, and first electrode 26 are formed on silicon oxide film 100 that has been formed on the surface of a silicon substrate. Explanation next regards the method of forming the metal dendrite.

Second electrode 32 and third electrode 34 are grounded and a negative voltage on the order of −0.5 V is applied to first electrode 26. The application of voltage to first electrode 26 causes a tunnel current to flow to ion conduction layer 42 by way of first insulating layer 52 from the point at which first electrode 26 contacts first insulating layer 52. Copper precipitates in ion conduction layer 42 from below first insulating layer 52 at the point of contact of first electrode 26 and toward second electrode 32, whereby metal dendrite 84 forms as shown in FIG. 7.

The three-terminal switch of the present working example can both reduce the leak current that flows in the second insulating layer between the first electrode and the second electrode and reduce the leak current that flows by way of the metal dendrite between the first electrode and the second electrode in the first insulating layer when in the OFF state. In addition, the present working example may also be applied to a two-terminal switch.

In the switching element of the present invention, the material for forming electrodes that do not supply metal ions to ion conduction layers 40 and 42 (the first electrode and a portion of the second electrode) is not limited to platinum, but can also be a refractory metal (W, Ta, Ti, and Mo) or a silicide (titanium silicide, cobalt silicide, and molybdenum silicide). In addition, the metal that forms electrodes that supply metal ions to ion conduction layers 40 and 42 (the third electrode and a portion of the second electrode) is not limited to copper, but may also be silver or lead. Still further, the ion conductor for forming ion conduction layers 40 and 42 is not limited to copper sulfide, but may also be a compound of a chalcogen element (O, S, Se, and Te) and a metal, a dielectric material that includes silicon (silicon oxide, silicon nitride, and silicon oxide nitride), or a perovskite oxide ($ABO_3$, A:Mg, Ca, Sr, Ba, and B:Ti)

Third Embodiment

The present embodiment is a device in which the switching element of the second embodiment is applied to programmable logic.

Figure 8:
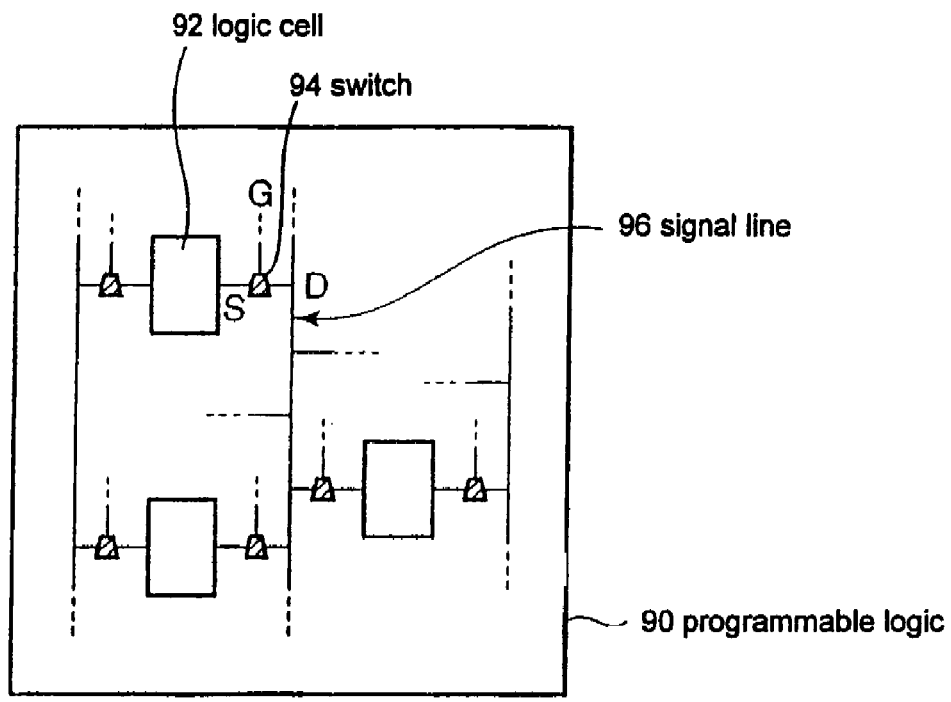
FIG. 8 is a schematic view showing an example of the configuration of programmable logic that uses the switch of second embodiment.

FIG. 8 is a schematic view showing an example of the configuration of programmable logic.

As shown in FIG. 8, programmable logic 90 is made up from: a multiplicity of logic cells 92 arranged in a two-dimensional array, interconnects for connecting the logic cells, and a multiplicity of switches 94 for switching between connection and non-connection between interconnects. Changing the connection states (connected/non-connected) of the two-terminal switches sets the configuration of interconnects between logic cells and the functions of the logic cells, whereby a logic integrated circuit that matches certain specifications can be obtained.

The switches are transistor elements composed of drain electrodes D, source electrodes S, and gate electrodes G. If the three-terminal switch of the above-described working example is applied to these switches, the first electrode corresponds to drain electrode D, the second electrode corresponds to source electrode S, and the third electrode corresponds to gate electrode G. As shown in FIG. 8, source electrode S is connected to logic cell 92, and drain electrode D is connected to signal line 96 in programmable logic 90.

A three-terminal switch that has been set to the ON state maintains a state in which source electrode S and drain electrode D are electrically connected. When a logic signal arrives at drain electrode D by way of signal line 96, the logic signal passes by way of source electrode S to be applied as input to logic cell 92. On the other hand, a three-terminal switch that has been set to the OFF state maintains a state in which the electrical connection between source electrode S and drain electrode D is cut. In this case, a logic signal cannot be applied as input to logic cell 92 that is connected to source electrode S even when the logic signal arrives at drain electrode D by way of signal line 96. The user is therefore able to set the connection state between logic cells in programmable logic 90.

Using the three-terminal switch of the present invention in programmable logic both reduces leak current when the switch is in the OFF state and decreases the overall current consumption of programmable logic compared to the related art.

Figure 9:
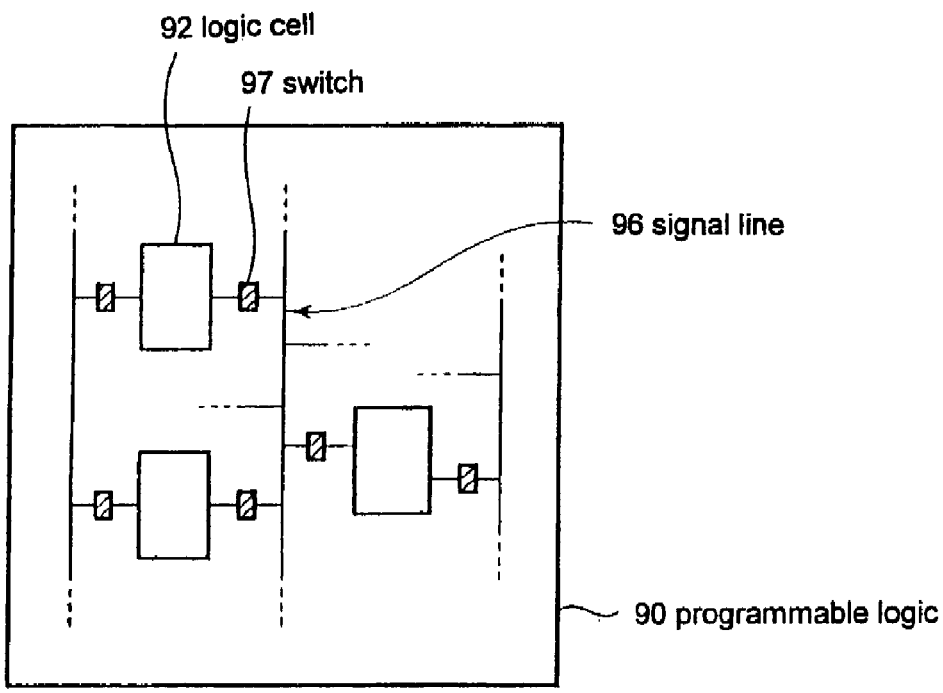
FIG. 9 is a schematic view showing an example of the configuration of programmable logic that uses the switch of the first embodiment.

FIG. 9 shows a case in which the two-terminal switch of the first embodiment is applied to programmable logic. Components identical to the programmable logic shown in FIG. 8 are given the same reference numbers. The two-terminal switch of the first embodiment is applied to switch 97 shown in FIG. 9. As described in the first embodiment, setting switch 97 to the ON state or OFF state enables setting of connection/non-connection of logic cell 92. The application of the two-terminal switch of the first embodiment to the switches of programmable logic obtains the same effects as the programmable logic shown in FIG. 8.

Further, although the switching element of the present invention was used for switching between connection/non-connection to a logic cell in the present embodiment, the switching element can also be applied to a switch for switching interconnects or for switching functions of logic cells. Programmable logic in which the circuit configuration can be altered by electronic signals in this way and thus offer a multiplicity of functions on a single chip include, for example, FPGA (Field-Programmable Gate Array) and DRP (Dynamically Reconfigurable Processor).

Fourth Embodiment

The present embodiment is a device in which the switching element of the second embodiment is applied to a memory element.

Figure 10:
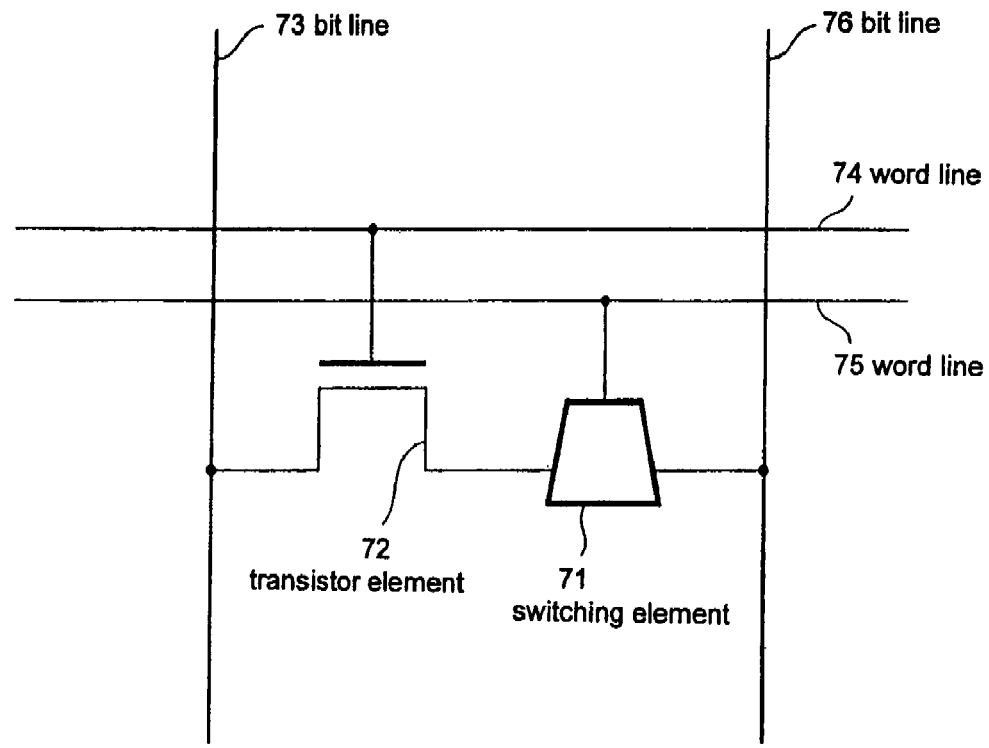
FIG. 10 is a schematic circuit diagram showing an example of the configuration of a memory element that uses the switch of the second embodiment.

FIG. 10 is a schematic view showing an example of the configuration of a memory element.

As shown in FIG. 10, the memory element includes switching element 71 for holding information, and transistor element 72 for reading the information of switching element 71. The three-terminal switch of the above-described working example is applied in this switching element 71. The configuration of switching element 71 is equivalent to that of a transistor composed of a drain electrode, a source electrode, and a gate electrode, these electrodes each corresponding to the first electrode, the second electrode, and the third electrode, respectively, of the three-terminal switch of the above-described working example.

The source electrode of transistor element 72 is connected to bit line 73 and the gate electrode is connected to word line 74. The source electrode of switching element 71 is connected to bit line 76 and the gate electrode is connected to word line 75. The drain electrode of switching element 71 is connected to the drain electrode of transistor element 72.

Explanation next regards the method of writing information to the memory element. Of the information "1" and "0" that is held, the ON state of the switching element is assumed to be "1" and the OFF state is assumed to be "0." In addition, the switching voltage of the switching element is assumed to be Vt, and the operating voltage of transistor element 72 is assumed to be VR.

When "1" is to be written to the memory element, voltage Vt is applied to word line 75 that is connected to the gate electrode of switching element 71, and the voltage of bit line 76 connected to the source electrode is set to 0 V. Voltage (Vt/2) is then applied to bit line 73. Switching element 71 enters the ON state and the information "1" is written.

When "0" is to be written to the memory element, the voltage of word line 75 connected to the gate electrode of switching element 71 is set to 0 V, and voltage Vt is applied to bit line 76 connected to the source electrode. Voltage (Vt/2) is then applied to bit line 73. Switching element 71 enters the OFF state and the information "0" is written.

Explanation next regards the method of reading the information saved in a memory element.

Voltage VR is applied to word line 74 to turn ON transistor element 72 and the resistance between bit line 73 and bit line 76 is found. This resistance is the combined resistance of switching element 71 and the ON resistance of transistor element 72. When this combined resistance is too great to measure, switching element 71 can be determined to be in the OFF state, from which it is understood that the information saved in the memory element is "0." On the other hand, when the combined resistance is smaller than a prescribed value, switching element 71 can be determined to be in the ON state, from which it is understood that the information saved in the memory element is "1."

Using the three-terminal switch of the present invention as a switching element for saving the information of a memory element reduces the leak current of the OFF state of the switch. As a result, using the memory element of the present embodiment in a memory device in which a plurality of memory elements are arranged in array form decreases the current consumption of the overall memory device compared to the related art.

Figure 11:
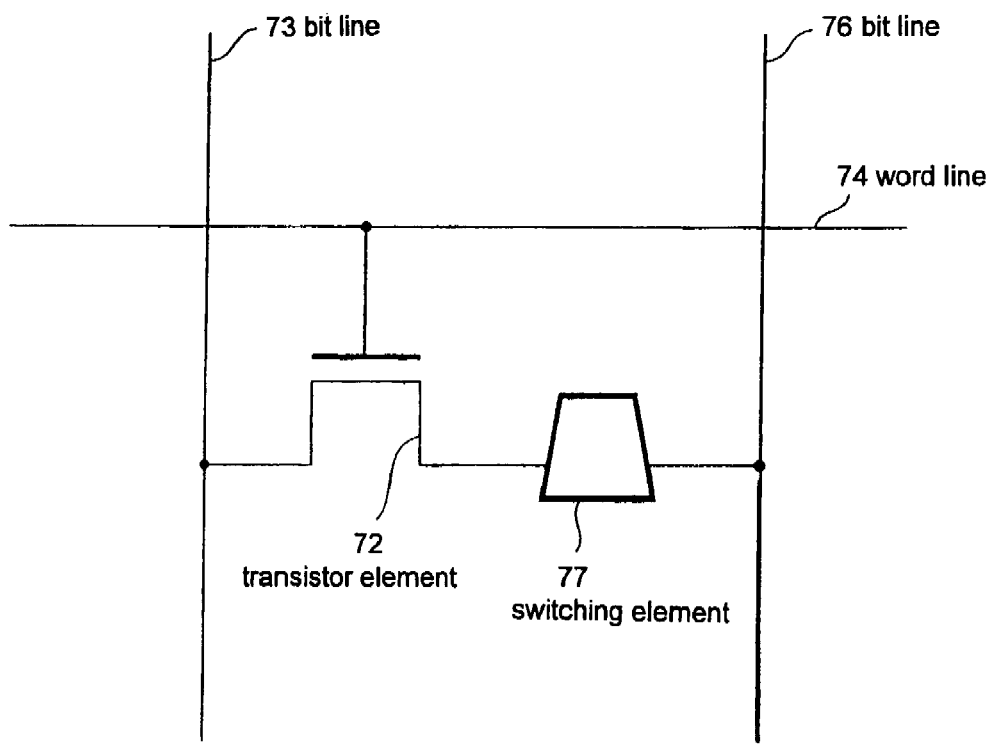
FIG. 11 is a schematic circuit diagram showing an example of the configuration of a memory element that uses the switch of the first embodiment.

FIG. 11 shows a case in which the two-terminal switch of the first embodiment is applied to a memory element. Components equivalent to the memory element shown in FIG. 10 are given the same reference numbers. The two-terminal switch of the first embodiment is applied to switching element 77 shown in FIG. 11. As explained in the first embodiment, information can be saved in switching element 77 by setting switching element 77 to the ON state or OFF state. Using the two-terminal switch of the first embodiment in a memory element obtains the same effects as the memory element shown in FIG. 10.

In addition, the present invention is not limited to the above-described working examples and is open to various modifications within the scope of the invention, these modifications obviously being included within the scope of the present invention.

The invention claimed is:

1. A switching element equipped with an ion conduction layer that can conduct metal ions, said switching element comprising:
   a first electrode and a second electrode provided in contact with said ion conduction layer: and
   a third electrode provided in contact with said ion conduction layer and that supplies said ion conduction layer with said metal ions to change states of electrical connection between said first electrode and said second electrode by application of voltage to said third electrode;
   wherein an area over which said first electrode contacts said ion conduction layer is smaller than an area over which said second electrode contacts said ion conduction layer.

2. The switching element according to claim 1, further comprising:
   an insulating layer provided between said first electrode and second electrode and in which an aperture is formed with a diameter of 0.1 μm or less;
   wherein said first electrode contacts said ion conduction layer by way of said aperture.

3. A switching element provided with an ion conduction layer that can conduct metal ions, said switching element comprising:
   an insulating layer provided in contact with said ion conduction layer;
   a first electrode provided in contact with said insulating layer;
   a second electrode provided in contact with said ion conduction layer; and
   a third electrode provided in contact with said ion conduction layer and that can supply said metal ions;
   wherein an area over which said first electrode contacts said insulating layer is smaller than an area over which said second electrode contacts said ion conduction layer.

4. The switching element according to claim 3, wherein a metal precipitate is provided by means of said metal ions between said second electrode and the point at which said first electrode contacts said insulating layer.

5. A switching element equipped with an ion conduction layer that can conduct metal ions, said switching element comprising:
   a first electrode provided in contact with said ion conduction layer;
   a second electrode provided in contact with said ion conduction layer and that can supply said metal ions; and
   an insulating layer provided between said ion conduction layer and said first electrode and in which an aperture is formed with a diameter of 0.1 μm or less;
   wherein an area over which said first electrode contacts said ion conduction layer by way of said aperture is smaller than an area over which said second electrode contacts said ion conduction layer.

6. The switching element according to claim 1, wherein a metal precipitate is provided by means of said metal ions between said second electrode and a point at which said first electrode contacts said ion conduction layer.

7. The switching element according to claim 2, wherein a metal precipitate is provided by means of said metal ions between said second electrode and a point at which said first electrode contacts said ion conduction layer.

8. The switching element according to claim 5, wherein a metal precipitate is provided by means of said metal ions between said second electrode and a point at which said first electrode contacts said ion conduction layer.

9. A reconfigurable logic integrated circuit that uses as a switch the switching element according to claim 1.

10. A reconfigurable logic integrated circuit that uses as a switch the switching element according to claim 3.

11. A reconfigurable logic integrated circuit that uses as a switch the switching element according to claim 5.

12. A memory element comprising:
    a switching element according to claim 1; and
    a transistor element for reading whether said switching element is in an ON state or in an OFF state.

13. A memory element comprising:
    a switching element according to claim 3; and
    a transistor element for reading whether said switching element is in an ON state or in an OFF state.

14. A memory element comprising:
    a switching element according to claim 5; and
    a transistor element for reading whether said switching element is in an ON state or in an OFF state.

* * * * *